United States Patent
Des Jardins

(10) Patent No.: US 9,794,617 B2
(45) Date of Patent: *Oct. 17, 2017

(54) INSERTING AD ELEMENTS

(71) Applicant: Advertising.com LLC, Dulles, VA (US)

(72) Inventor: G. Thomas Des Jardins, Alexandria, VA (US)

(73) Assignee: Advertising.com LLC, Dulles, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/148,345

(22) Filed: May 6, 2016

(65) Prior Publication Data
US 2016/0255396 A1    Sep. 1, 2016

Related U.S. Application Data

(63) Continuation of application No. 14/317,563, filed on Jun. 27, 2014, now Pat. No. 9,338,506, which is a
(Continued)

(51) Int. Cl.
*H04N 7/10* (2006.01)
*H04N 21/431* (2011.01)
(Continued)

(52) U.S. Cl.
CPC ....... *H04N 21/4316* (2013.01); *C09D 11/322* (2013.01); *H01B 1/22* (2013.01);
(Continued)

(58) Field of Classification Search
CPC ....... H04N 21/23424; H04N 21/26241; H04N 21/2668
See application file for complete search history.

(56) References Cited

U.S. PATENT DOCUMENTS 5,774,666 A    6/1998 Portuesi
6,240,555 B1   5/2001 Shoff et al.
(Continued)

OTHER PUBLICATIONS

"Helix Universal Server Administration Guide," http://service.real.com/help/library/guides/helixuniversalserver/realsrvr.htm, Real Networks, Inc., pp. 1-16, May 19, 2003.
(Continued)

*Primary Examiner* — Junior Mendoza
(74) *Attorney, Agent, or Firm* — Finnegan, Henderson, Farabow, Garrett & Dunner LLP

(57) ABSTRACT

Systems and methods are provided for presenting branding elements with electronic content. In one implementation, a method is provided that includes receiving, from a user device, a request that identifies a segment of electronic content and that contains information specifying a display configuration of the user device. The method further includes selecting first metadata including information defining how at least one branding element is to be presented based on the display configuration of the user device, and selecting second metadata for the requested segment of electronic content, the second metadata including information related to presenting the requested segment of electronic content. Additionally, the method includes instructing the user device to generate a presentation based on the selected first metadata and the selected second metadata, the presentation including the requested segment of electronic content and the at least one branding element.

20 Claims, 4 Drawing Sheets

Related U.S. Application Data continuation of application No. 13/486,922, filed on Jun. 1, 2012, now Pat. No. 8,769,565, which is a continuation of application No. 13/163,920, filed on Jun. 20, 2011, now Pat. No. 8,201,201, which is a continuation of application No. 12/625,113, filed on Nov. 24, 2009, now Pat. No. 7,987,483, which is a continuation of application No. 11/362,351, filed on Feb. 27, 2006, now Pat. No. 7,631,330.

(60) Provisional application No. 60/656,455, filed on Feb. 23, 2005.

(51) Int. Cl.
| | | |
|---|---|---|
| *C09D 11/322* | (2014.01) | |
| *H01B 1/22* | (2006.01) | |
| *H01B 1/24* | (2006.01) | |
| *H01C 17/065* | (2006.01) | |
| *H01G 4/08* | (2006.01) | |
| *H05K 1/09* | (2006.01) | |
| *H04N 21/435* | (2011.01) | |
| *H04N 21/443* | (2011.01) | |
| *H04N 21/472* | (2011.01) | |
| *H04N 21/482* | (2011.01) | |
| *H04N 21/81* | (2011.01) | |
| *H04N 21/8545* | (2011.01) | |
| *H05K 3/12* | (2006.01) | |

(52) U.S. Cl.
CPC ......... *H01B 1/24* (2013.01); *H01C 17/06526* (2013.01); *H01G 4/08* (2013.01); *H04N 21/435* (2013.01); *H04N 21/4438* (2013.01); *H04N 21/47202* (2013.01); *H04N 21/4825* (2013.01); *H04N 21/812* (2013.01); *H04N 21/8133* (2013.01); *H04N 21/8545* (2013.01); *H05K 1/097* (2013.01); *H05K 3/125* (2013.01); *H05K 2203/013* (2013.01)

(56) References Cited

U.S. PATENT DOCUMENTS

| | | | |
|---|---|---|---|
| 7,120,924 B1 | 10/2006 | Katcher et al. | |
| 7,143,432 B1* | 11/2006 | Brooks | H04N 21/234363 370/437 |
| 7,444,659 B2 | 10/2008 | Lemmons | |
| 7,631,330 B1* | 12/2009 | Des Jardins | H04N 7/17336 715/205 |
| 7,987,483 B1* | 7/2011 | Des Jardins | H04N 7/17336 725/34 |
| 8,201,201 B2* | 6/2012 | Des Jardins | H04N 7/17336 725/34 |
| 8,769,565 B2* | 7/2014 | Des Jardins | H04N 7/17336 725/32 |
| 9,338,506 B2* | 5/2016 | Des Jardins | H04N 7/17336 |
| 2002/0059590 A1 | 5/2002 | Kitsukawa et al. | |
| 2003/0126597 A1 | 7/2003 | Darby et al. | |
| 2003/0149983 A1 | 8/2003 | Markel | |
| 2004/0019901 A1* | 1/2004 | Spio | H04N 7/165 725/25 |
| 2005/0229233 A1 | 10/2005 | Zimmerman et al. | |
| 2010/0180296 A1* | 7/2010 | Hendricks | H04H 20/10 725/34 |
| 2011/0035769 A1 | 2/2011 | Candelore et al. | |
| 2011/0321087 A1* | 12/2011 | Huber | G06Q 30/02 725/34 |
| 2012/0167134 A1 | 6/2012 | Hendricks et al. | |
| 2013/0031582 A1 | 1/2013 | Tinsman et al. | |

OTHER PUBLICATIONS

"RealSystem Production Guide," http//service.real.com/help/library/guides/production8/realpgd.htm, Real Networks, Inc., pp. 105, Dec. 12, 2000.

Buthillier, Larry, "How to Brand Your Video with a Watermark," http://www.streamingmedia.com/r/printerfriendly.asp?id=8526, Oct. 28, 2003, pp. 1-2.

\* cited by examiner

INSERTING AD ELEMENTS

CLAIM OF PRIORITY

This application is a continuation of U.S. application Ser. No. 14/317,563, filed on Jun. 27, 2014 (now allowed), which is a continuation of and claims priority to U.S. application Ser. No. 13/486,922, filed on Jun. 1, 2012 (now U.S. Pat. No. 8,769,565), which is a continuation of and claims priority to U.S. application Ser. No. 13/163,920, filed on Jun. 20, 2011 (now U.S. Pat. No. 8,201,201), which is a continuation of and claims priority to U.S. application Ser. No. 12/625,113, filed on Nov. 24, 2009 (now U.S. Pat. No. 7,987,483), which is a continuation of and claims priority to U.S. application Ser. No. 11/362,351, filed on Feb. 27, 2006 (now U.S. Pat. No. 7,631,330), which claims priority to U.S. Provisional Application No. 60/656,445, filed on Feb. 25, 2005. The contents of all of the above-listed applications are expressly incorporated herein by reference.

TECHNICAL FIELD

This disclosure relates generally to the delivery of content and associated elements to end users.

BACKGROUND

Video content may be delivered across packet-based networks, such as the Internet, and presented to users by a media player. A media player may operate to present such content in at least two general ways. First, the media player can begin playing the content while the content is sent over the network. This is generally referred to as streaming, and the associated content may generally be referred to as streaming content. Streaming content may present certain advantages to the end-users, such as reducing the time between the content's selection and display and removing the need for client-side storage of media files.

Streaming content typically falls into two general categories: broadcast and on-demand. To a streaming server, a broadcast source is usually any external video or audio feed, such as a television or radio station, whereas an on-demand source is usually a multimedia file chosen by the user.

Broadcast streams are generally entered "in progress" by users. Each client connects to a single "pushed" stream so all clients experience the same portion of the media at the same time. On-demand streams are generally discrete "pulled" multimedia segments, such as individual songs or video clips that are delivered to each client upon request. Each client starts at the beginning of the clip.

Second, as an alternative to streaming, the content may be completely downloaded in advance of play by the media player. The content associated with this method of operation may generally be referred to as downloaded content. The download approach may allow for delivery of higher-definition content than what the user's network connection might otherwise support when streaming, and may allow for offline viewing of content. Additionally, allowing the user to download high-definition content in advance of play may reduce the content publisher's reliance on most expensive streaming technologies.

SUMMARY

In one aspect, one or more sets of branding metadata are associated with a segment of video content. Each of the sets of branding metadata include information related to presenting at least one branding element in association with the segment of video content. Also, one or more sets of content metadata are associated with the segment of video content, each of the sets of content metadata include information related to presenting the segment of video content. Business rules are stored. The business rules are for selecting at least one of the sets of branding metadata and for selecting at least one of the sets of content metadata. A request that indicates the segment of video content is received, and in response to receiving the request, at least one of the sets of branding metadata associated with the segment of video content is selected based on the business rules. Also in response to receiving the request, at least one of the sets of content metadata associated with the segment of video content is selected based on the business rules; and a client system is instructed to generate a presentation based on the selected set of branding metadata and the selected set of content metadata. The presentation includes the segment of video content and the branding element.

Implementations may include one or more of the following features. For example, the contest metadata may indicate that the segment of video content should be presented in a fullscreen mode. Instructing the client system to generate the presentation then may include instructing the client system to generate the presentation such that the segment of video content and the branding element are presented together in a fullscreen video rendering window. The client system may be instructed to generate the presentation such that the branding element is overlayed on top of the segment of video content.

The branding metadata may indicate that the branding element should be overlayed on top of the segment of video content when a video rendering window presenting the segment of video content is in a fullscreen mode. Instructing the client system to generate the presentation in that case may include instructing the client system to generate the presentation such that the branding element is overlayed on top of the segment of video content when a video rendering window preserving the segment of video content is in a fullscreen mode.

The branding metadata may indicate that the branding element should be presented in an area around a video rendering window when a video rendering window presenting the segment of video content is not in a fullscreen mode. In that case, instructing the client system to generate the presentation may include instructing the client system to generate the presentation such that the branding element is presented in an area surrounding a video rendering window when the video rendering window is not in a fullscreen mode.

The business rules may include business roles for selecting one of the sets of branding metadata and one of the sets of content metadata based on one or more of the following: a surface point from which the segment of video consent was selected, user specific information, a consent category of the segment of video content, or an identity of the segment of video content. The branding element may include one or more of she following: a branding/advertising element, a playlist contextual element, an environmentally targeted contextual element, or a program contextual element.

Instructing the client system to generate the presentation may includes instructing the client system to access and present the branding element while the segment of video content is presented. Alternatively, or additionally, instructing the client system to generate the presentation may include instructing the client system to blend together the branding element and the segment of video content to create a single video file.

The content metadata may include a playlist of media items, with one of the media items being the segment of video content. The branding metadata may indicate that the branding element is a playlist contextual element and that information presented by the playlist contextual element is to be obtained from the playlist.

In another aspect, one or more sets of branding metadata are stored. Each of the sets of branding metadata includes information related to presenting at least one branding element in association with a segment of video content. Also, business rules for selecting at least one of the sets of branding metadata are stored. At least one of the sets of branding metadata is selected based on the business rules and a client system is instructed to generate a presentation based on the selected set of branding metadata. The presentation includes the segment of video content and the branding element.

Implementations may include one or more of the following features. For example, the branding metadata may indicate that the branding element should be overlayed on top of the segment of video content or the branding metadata may indicate that the branding element should be presented in an area around a video rendering window that presents the segment of video content. The branding metadata may indicate that the branding element should be presented in an area around a video rendering window that presents the segment of video content when the video rendering window is not in a fullscreen mode and that the branding element should be overlayed on top of the segment of video content when the video rendering window is in the fullscreen mode.

The business rules may include business rules for selecting one of the sets of branding metadata based on one or more of the following: a surface point from which the segment of video content was selected, user specific information, a content category of the segment of video content, or an identity of the segment of video content. Use branding element may include one or more of the following: a branding/advertising element, a playlist contextual element, an environmentally targeted contextual element, or a program contextual element. The branding metadata may that the branding element is a playlist contextual element and that information presented by the playlist contextual element is to be obtained from a playlist that includes the segment of video content.

Also, one or more sets of content metadata may be stored. Each set of content metadata may include information related to presenting the segment of video content. Business rules for selecting one of the sets of content metadata also may be stored. One of the sets of content metadata associated with the segment of video content may be selected based on the business rules for selecting one of the sets of content metadata. Instructing a client system to generate a presentation based at least on the branding metadata may include instructing the client system to generate the presentation based on the branding metadata and the content metadata.

Implementations of the described techniques may include hardware, a method or process, and computer software on a computer-accessible medium.

The details of one or more implementations are set forth in the accompanying drawings and the description below. Other features will be apparent from the description and drawings, and from the claims.

DETAILED DESCRIPTION

Generally, a video rendering window on a client system (e.g., a personal computer (PC) or a personal video recorder (PVR)) may display video (e.g., live or on-demand streaming video, downloaded video, or recorded video) to a user. There may be any number of circumstances when it is desirable to display branding and other elements inside the video rendering window (e.g., overlayed on top of the video being presented in the video rendering window). This may be true, for example, when the video rendering window is displayed fullscreen (that is, it takes up the entire viewing space of the display device). When video is displayed fullscreen, there may be nowhere to place the branding and similar elements outside of the video rendering window such that they will be seen. For instance, if a user switches from a "normal" mode (e.g., where the video rendering screen is less than fullscreen and may be surrounded by HTML pages or other elements) to a fullscreen mode, this selection may cause branding and other elements displayed in HTML pages or other areas outside of the video rendering window to be covered op by the video rendering window, and therefore no longer visible to the user. Thus, it may be desirable to display such elements inside the video rendering window when the window is in a fullscreen mode. Furthermore, there may be any number of circumstances when it is desirable to display branding and other elements inside the video rendering window, regardless of whether the video rendering window is fullscreen or not.

Examples of branding and other elements that may be displayed inside or outside of the video rendering window include branding/advertising elements (e.g., source or sponsor logos such as AOL®, CNN®, and NFL®), playlist contextual elements (e.g., previews of upcoming programming), environmentally targeted elements (e.g., weather alerts), and program contextual elements (e.g., sports scores, and information about an artist or movie). In general these various elements will be simply referred to as branding elements below.

Such elements generally have the following basic attributes:

Behavior: How an element behaves when displayed. Examples include movement and action when selected.

Presentation: The interaction that an element has visually with the video. Examples include transparency or opaqueness.

Location: Instruction to the video rendering engine that tell it where an element is placed in relationship to the video.

Source: The location where the element is to be retrieved from, such as a Uniform Resource Locator (URL).

Typical applications of such elements include channel branding, program sponsorship, previews of upcoming programming, and interactive programming guides.

Figure 1:
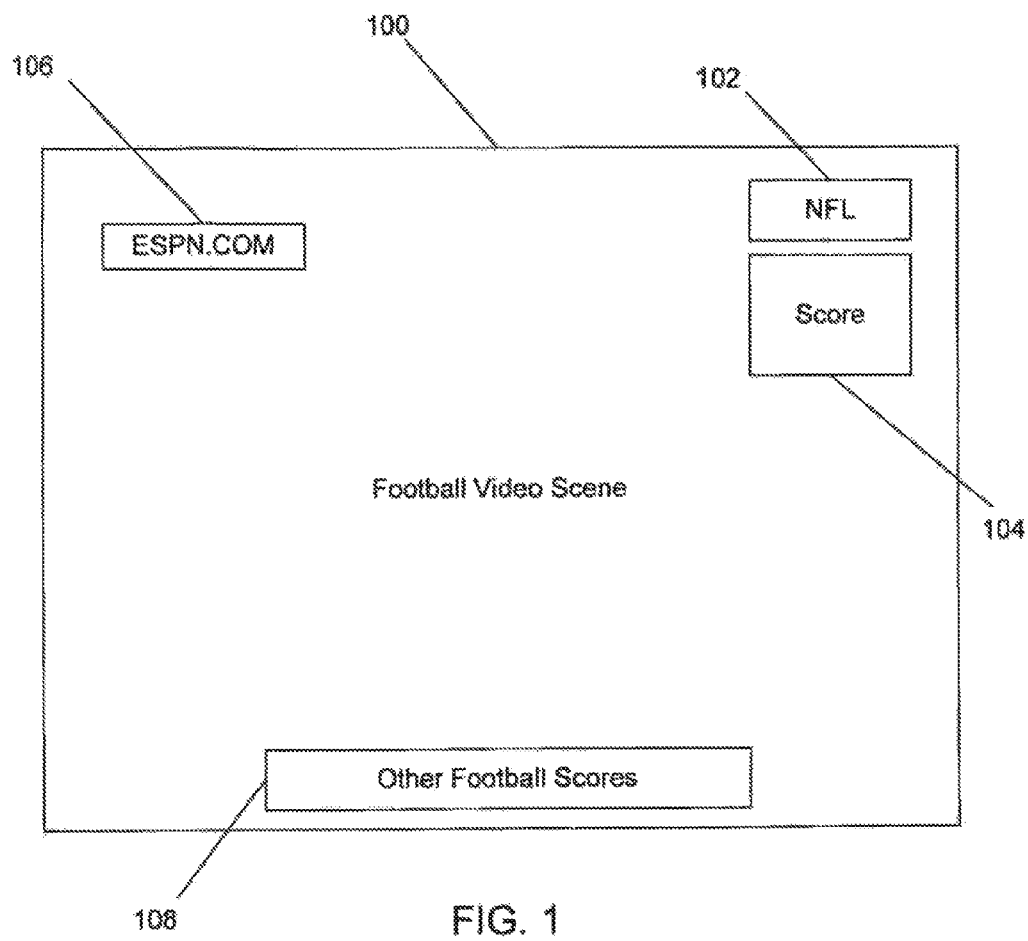
FIG. 1 is an illustration showing an example of a video scene that includes branding elements overlayed on top of the video scene.

Referring to FIG. 1, shown is an example of a video scene 100 including branding elements overlayed on top of the video scene 100. The video scene 100 is, for example, a scene from a football game.

The branding elements include a first branding element 102 placed in the upper right-hand corner of the video, a second branding element 104 below the first branding element 102, a third branding element 106 placed in the upper left-hand corner of the video scene 100, and a fourth branding element 108 placed in the bottom center of the video scene 100.

The first branding element 102 is a branding/advertising element that indicates the original provider of the content, such as, for example the NFL®. The second branding element 104 is a program contextual element that displays the score of the football game shown in the video scene 100. The third branding element 106 is another branding/advertising element that indicates the surface location or channel that is making the video available for viewing, such as, for example, ESPN.COM®. The fourth branding element 108 is another program contextual element that displays the scores of football games other than the one shown in video scene 100.

The following discussion describes techniques that permit the flexible display of branding elements such as branding messages, sponsorship icons, and interactive elements such as in video ad curtains and programming information, within a video rendering window or outside of the video rendering window.

In general, the following discussion describes a system that permits the flexible introduction of branding elements into or around video rendered by a media player. One or more sets of metadata related to the presentation of branding elements may be collected, and then one or more sets of the metadata may be selected based on business rules when the media player requests a particular piece of content. The selected metadata may indicate what branding element is to be displayed, and how it is to be displayed (e.g., position of element in video rendering window). The media player is then instructed based on the metadata to access and appropriately place the branding elements in or outside of the video rendering window (e.g., overlayed on top of the video content).

In some implementations, how the branding element is to be displayed may depend on whether the media player is full screen or not. For instance, the branding elements may be displayed in the video rendering window when the media player is fullscreen, but be displayed in surrounding elements, such as HTML pages, when the media player is not in full screen mode. In this case, the media player may use the metadata to appropriately place the branding elements in the video rendering window (e.g., overlayed on top of the video content) or in the surrounding elements, such as HTML pages, depending on the state of the media player. The metadata also may indicate to the media player what mode the content should be displayed in, e.g. fullscreen, normal, or any.

Figure 2:
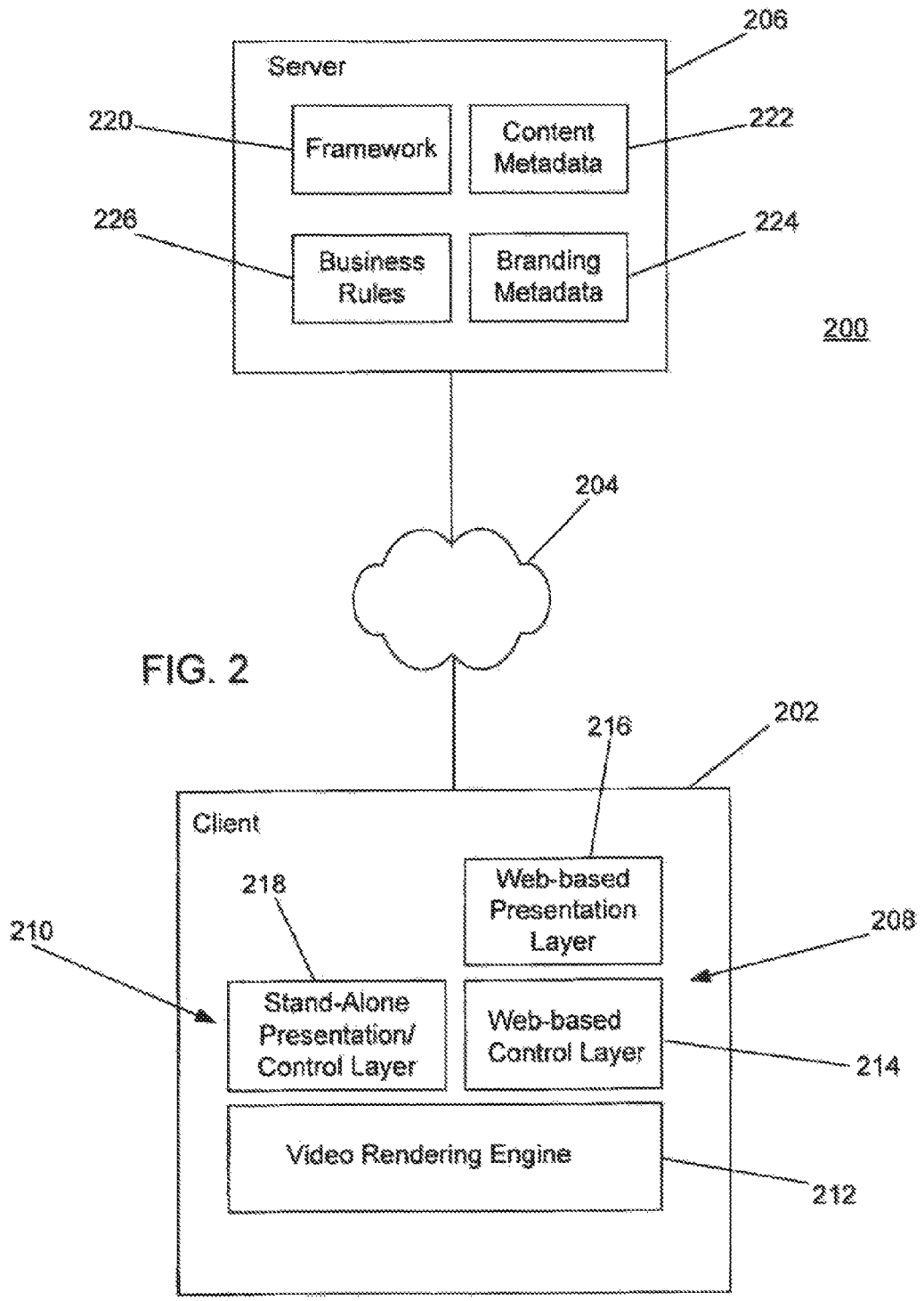
FIG. 2 is a diagram illustrating a system in which branding elements are presented in association with video content.

Referring to FIG. 2, a system 200 includes a client system 202 that can communicate with a server system 206 over a packet-switched network 204, such as the Internet. In general, the server 206 receives a request from the client system 202 regarding a segment of video content. The server 206 then instructs the client system 202 to access the segment of video content and associated branding elements (and possibly other video content), and to synchronize the presentation of the video and the associated branding elements, as discussed further with respect to FIG. 3.

The client system 202 or server system 206 may be implemented using, for example, a general-purpose computer, a personal computer (PC), a special-purpose computer, a workstation, a server, a personal video recorder, a media center PC, a device, a component, or other equipment or some combination thereof capable of responding to and executing instructions. These components may receive instructions from, for example, a software application, a program, a piece of code, a device, a computer, a computer system, or a combination thereof which independently or collectively direct operations, as described herein.

Packet switched network 204 may include Wide Area Networks (WANs), Local Area Networks (LANs), analog or digital wired and wireless telephone networks (for example, a Public Switched Telephone Network (PSTN), an Integrated Services Digital Network (ISDN), or a Digital Subscriber Line (xDSL)), or any other wired or wireless network including, for example, a corporate LAN. Network 204 may include multiple networks or subnetworks, each of which may include, for example, a wired or wireless data pathway.

A media player application may be implemented on client system 202 as a web-based media player application 208 or a stand-alone media player application 210. The web-based media player application 208 may include a video tendering engine 212, a web-based control layer 214, and a web-based presentation layer 216.

The web-based presentation layer 216 may be, for example, a Hypertext Markup Language (HTML) based web page and the web-based control layer 218 may be, for example, Javascript code included as a part of the HTML based web-page. The video rendering engine 212 may be, for example, a media player, such as the Windows Medial Player from Microsoft Corporation or the RealPlayer® from RealNetworks, Inc., embedded in the HTML based webpage. The video rendering engine 212 may render the video in a video rendering window displayed in the HTML based web-page. Thus, from the user perspective, the web-based media player application 208 may include an HTML based web-page having an embedded video rendering window that is surrounded by various elements such as branding elements or the video rendering engine controls.

In general, the web-based presentation layer 216 controls the placement of the video rendering window and presentation of elements surrounding the video rendering engine (for example, branding elements and/or video rendering engine control elements). The web-based control layer 214 implements logic based on events, such as a user input to the web-based presentation layer 216 or instructions from server 206. In general, the events may be synchronous or asynchronous and may be relative or absolute to the video timeline or local time, where the video timeline may be expressed as time, frames or other means, and where the events themselves may be transmitted in band with the video stream or out of band using a separate communication session. The web-based control layer 214 also provides information to the web-based presentation layer 216 such that the web-based presentation layer 216 changes the presentation of elements surrounding the video rendering window. The web-based control layer 216 also generally controls the video rendering engine 212 based on user input to the web-based presentation layer 216 and other events.

The stand-alone media player application 210 may include the video rendering engine 212 and a single (or separate) presentation/control layer 218 that operates to provide similar functions as the web-based presentation layer 216 and web-based control layer 214. The stand-alone media application may be, for example, the Windows Media® Player or the Real Player. Similar to the web-based media player application 208, the stand-alone media player application 210 may include a video rendering window with elements (e.g., branding elements or video controls) presented around the video rendering window. Also similar to the web-based media player application 208, some of the surrounding elements may be displayed using, for example, HTML based documents.

The server 206 includes a framework 220 that allows advertising and/or editorial/programming staff to associate one or more sets of content metadata 222 and one or more sets of branding metadata 224 with a given segment of video content. The segment of video content may be, for example, a broadcast or on-demand streaming video, or a downloaded video.

A set of content metadata may indicate, for example, a playlist that includes one or more types of media items to be rendered by the video rendering engine 212, including the given segment of video content. For instance, the playlist may indicate that an advertisement should be rendered and then the segment of video content should be rendered. A set of content metadata also may indicate a screen state (e.g., fullscreen, normal, or any) for the video rendering window for each of the media items in the playlist.

Generally, a set of branding metadata indicates one or more branding elements to be presented in association with the give segment of video content and indicates the behavior and presentation of the branding elements in the video rendering window. Also, the branding metadata may include an indication of the behavior and presentation of the branding elements in an HTML page or other area surrounding the video rendering window in implementations in which the placement of the branding depends on the state of the video rendering window (e.g., fullscreen or normal). A set of branding metadata also may indicate one or more branding elements to be presented in association with other media items in a playlist included as part of the content metadata, and the behavior and presentation of those branding elements.

A set of branding metadata may include the data elements shown in table 1 below for each branding element associated with the given segment of video content and any other media items indicated in a set of content metadata.

Examples of values for some of the data elements shown in table 1 are shown in table 2 below.

TABLE 2

| | |
|---|---|
| Behaviors | Changes when moused |
| | Clickable |
| | Scrolled |
| | Flys on/off |
| | Frame Start time |
| | Frame End time |
| | Relative Start time |
| | Relative End time |
| Presentations | Translucent |
| | Blended with content |
| | Opaque |
| Location | X, Y, relative to origin (not absolute coordinates) |
| | X, Y, absolute |
| Sources | Uniform Resource Locator indicating location of branding element file |

The framework 220 generally includes an interface that allows an advertising and/or editorial/programming staff to enter a set of content metadata and associate that set of content metadata with the given segment of video content. Thus, for example, if a sports clip is to be made available for selection, the staff may use the interface to designate a playlist that includes the sports clip and advertising video (e.g., advertisements, previews, branding video) that is displayed with the sports clip, and to associate that playlist with the sports clip. The staff may designate, for instance, that an advertisement be shown before the sports clip is shown and that both the advertisement and sports clip are to be shown in full screen mode.

The interface also allows the advertising and/or editorial/programming staff to enter a set of branding metadata and associate that set of branding metadata with the given segment of video content. More specifically, the staff may associate a particular branding element with the given segment of video content, and enter the data as to how that branding element is to be displayed in the video rendering window (and in some implementations, how that element is displayed in a surrounding HTML page or other surrounding element). For example, the staff may designate a corporate logo as being associated with the sports clip, and may designate that this logo should be displayed in the upper right corner of the video rendering window and that the logo be fully opaque (or translucent). The interface also may allow the staff to designate branding elements for each video in the playlist and how those branding elements are to be displayed in the video rendering window (and in some implementations, how the branding element will be displayed in surrounding elements when the media player is in normal mode).

TABLE 1

| Name | Behavior | Presentation | Location | Source | Mouseover | double click | single click |
|---|---|---|---|---|---|---|---|
| User Defined name, Might include addressable screen regions or MPEG object names | Any legal behavior, used to describe timing or movement | Used to describe blending with background | Relative or Absolute position of Element in the Video Rendering Window | Location of branding element | Element name, javascript, html or hyperlink to access if mouse'd over | Element name, javascript, html or hyperlink to access if double clicked | Element name, javascript, html or hyperlink to hit if single clicked |

Some of the designated branding elements in the branding metadata may obtain their information based on the user's selection of content to be played in the future, or based on the playlist contained in the content metadata. For instance, a branding element may be displayed in a video segment and indicate what video segments will be played in the future, based on a playlist of user selections and/or the playlist provided in the content metadata. For instance, if a preview of a new sports movie is to be played after a sports clip, a branding element may be displayed inside the video rendering window and indicate that a preview of the new movie is coming up next, and that the viewer should "stay tuned" to see it. The information regarding the new movie (e.g., title) may have been retrieved from the content metadata (rather than being specifically entered by the staff when they designated that branding element accompany the sports clip). As another example, an element may show the list of programming content (that is, the content that a user desires to see, as opposed to branding or advertising) that will be played after the present selection.

The interface also allows the staff to enter and associate more than one set of content metadata and more than one set of branding metadata with the given segment of video content, and to indicate business rules 226 for selecting one or more of the sets of content metadata and one or more of the sets of branding metadata when the segment of video content is requested. The business rules 226 may, for example, designate which set(s) of content metadata and which set(s) of branding metadata to use based on the surface location from which the segment of video content was selected. In general, a provider of content may provide the same content from a number of different surface locations. For example, a content provider may make a particular segment of video content available on an "entertainment" themed web page and on a "top news" themed web page. It such situations, it may be desirable to have different playlists and different branding elements depending on the surface location from which the segment of video content was selected.

Thus, for example, a sports clip may be made available at one surface location, such as a sports web page, and the staff can designate a set of branding metadata for the sports clip when the clip is selected from the sports page. The sports clip also may be made available on a news web page. The staff can also designate a different set of branding metadata to be used when the sports clip is selected from the news web page. Which sets are used then depends on the surface location (sports web page or news web page) from which the user selected the sports clip for presentation. Therefore, for example, one set of branding metadata may indicate one logo for display when the sports clip is selected from the sports web page, while the second set of metadata may indicate a different logo for display when the sports clip is accessed from the news web page.

Additionally, or alternatively, the business rules 226 may, for example, designate which set(s) of content metadata and which set(s) of branding metadata to use based on a content category (e.g., sports or music) of the segment of video content, based on user specific information (e.g., the number of times a branding element has already been shown to a particular user), and/or based on an identity of the segment of video content (e.g., a specific movie).

Similar to the situation with the surface location business rules, it may be desirable to have different playlists and different branding elements depending on the content category of the segment of video content, regardless of which site location from which the content was selected. For instance, the staff may designate that a certain branding logo be shown with sports content. In such a situation, the branding logo may be displayed with the video content, regardless of whether the video content was selected from a sports web page or a news web page.

By basing business rules 226 on user specific information, it is possible to tailor the video experience to a certain user. For example, it may be desirable to limit the number of times in a certain time period (or for a certain quantity of video) that a branding element is shown to the user. For example, if the user has selected, from a single surface location, more than one segment of video content to be presented back-to-back, then it may be desirable to only display a logo for the surface location in the first one of the segments, rather than in all of them. As another example, user specific information, such as a geographic location of the user, may be used to tailor environmentally contextual elements (e.g., weather alerts) to the user.

Basing business rules 226 on the identity of the content may allow for a set of branding metadata that that controls the placement or insertion of branding elements in a manner that is specific to the particular content. For example, a particular movie may have certain dramatic scenes in which it is desirable to not present any branding overlayed on top of the movie. Similarly, for example, there may be certain times during a particular movie in which a branding element should not be overlayed on top of a certain portion of the video (e.g., because it may cover up the area of the video in which certain action is taking place). In such situations, it may be desirable to designate branding metadata that prevents the overlay of branding elements during the times and/or areas of the video.

The interface may allow the staff to associate sets of metadata with a given segment of video content directly by associating it with the segment specifically, or indirectly by associating the metadata with, for example, a content category of the video content or a surface location from which the segment of content is available. For example, if the segment of video content is a sports related video, the interface may allow the staff to enter and indirectly associate a set of branding metadata with the sports related video by associating the set of branding metadata with a sports category. Similarly, for example, the staff may enter and indirectly associate a set of branding metadata with the sports related video by associating the set of branding metadata with a sports web page from which the sports related video is available.

Figure 3:
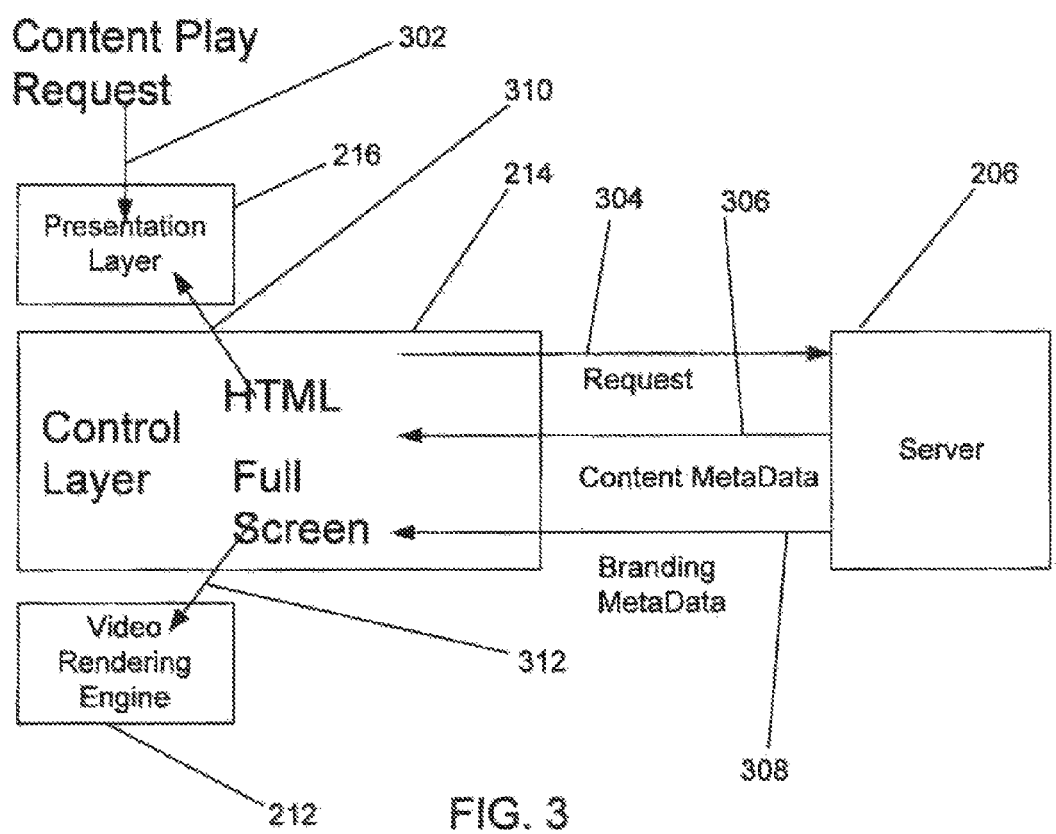
FIG. 3 is a diagram illustrating an example of an operation of the client system and server system shown in FIG. 2.

FIG. 3 illustrates an example of the operation of web-based media player application 208 and server 206 in an implementation in which the control layer 214 causes the branding elements to be displayed in the video rendering window or in surrounding HTML pages depending on the state of the video rendering window. An implementation of the stand-alone media player application 210 may operate in the same fashion, with the single control/presentation layer 218 performing the operations described with respect to web-based control layer 214 and web-based presentation layer 216.

When a user makes a video content request (e.g., by selecting a play button), the presentation layer 216 informs the control layer 214 of the content request (302). The control layer 214 sends a request to the server 206 (304). The request may indicate one or more of an identity of the requested video, a content category of the requested video, a surface location from which the video was requested, or a user identifier that may be used to determine user specific information (e.g., a globally unique identifier (GUID)).

The server 206 uses the information in the request to select the appropriate set(s) of content metadata and the appropriate set(s) of branding metadata based on the business rules. The server 206 may store the business rules locally or remotely, and access them as appropriate to select the set(s) of metadata. When the rules are stored remotely, they may be accessed through the exchange of rules at the server-to-server layer, or they may be accessed through the client system 202, for example, by using explicit security policies.

The server 206 then instructs the media player application 208 to access the requested video and associated branding elements and generate a presentation that includes the requested video and branding elements appropriately synchronized, for example, by sending the selected set(s) of content metadata and selected set(s) of branding metadata to the control layer 214 (306 and 308). Depending on the selected set(s) of content metadata, the presentation may also include other video content, such as advertisements. As described above, the content metadata may include a playlist of media items, where one of the media items is the requested video. The playlist may include, for example, an ordered list of the locations (for example, Uniform Resource Locators (URLs)) of the various media items. Also, depending on the selected set(s) of branding metadata, the presentation also may include other branding elements appropriately synchronized with the other video content.

The content metadata and branding metadata may be sent from the server 206 in, for example, a extensible mark-up language (XML) or other mark-up language format. Further, the branding and content metadata may be sent separately or may be sent together. For instance, the branding and content metadata may be sent as separate files, or may be sent in a single Synchronized Multimedia Integration Language (SMIL) file.

Depending on the state of the video rendering window, the control layer 214 causes the branding elements to be displayed in the video rendering window (312) or in surrounding HTML pages (310). For instance, when the media player 208 is in full screen mode, the control layer 214 causes the branding elements to be displayed in the video rendering window (e.g., overlayed on top of the video) (312) and, when the player is not in fullscreen mode (that is, normal mode), the control layer 214 causes the branding elements to be displayed in a surrounding HTML page (310).

The control layer 214 may cause the appropriate display of the branding elements by parsing the branding metadata and instructing the presentation layer 216 or video rendering engine 212 appropriately. Alternatively, the control layer 214 may pass the metadata directly to the rendering engine 212 or presentation layer 216, which parses the metadata and causes the appropriate display to occur. A combination of these techniques may be used. For example, the control layer 214 may parse the metadata and instruct the presentation layer 216 as appropriate when the video rendering window is not in fullscreen mode, while passing the branding metadata (e.g., in a SMIL format) to the video rendering engine 212 when the video rendering window is in a fullscreen mode In some implementations, rather than, or in addition to, blending the separate branding elements and video together on-the-fly as the video is displayed by the media player 208, the video and branding elements may be blended together to create a single video file having the branding elements blended with the video. This single file then may be available for export to a portable player, such as a portable video player, where the single video file can be displayed without the need to blend branding and video elements together on-the-fly as the video is being presented.

The media player 208 also may send back measurement data to the server 206 or another server. The measurement data may indicate when the media player 208 is in full screen mode, when the user is fast forwarding or rewinding the media, and/or when the media player is in the background or in the foreground. The measurement data also may indicate what media the media player is presenting, as well as from where the media was selected or retrieved. The measurement data may allow the provider of the media and/or the provider of the branding and advertisements to analyze the manner users interact with certain content, thereby allowing the provider and advertisers to make better choices about whether to place advertisements or branding, and when and where to place them.

Figure 4:
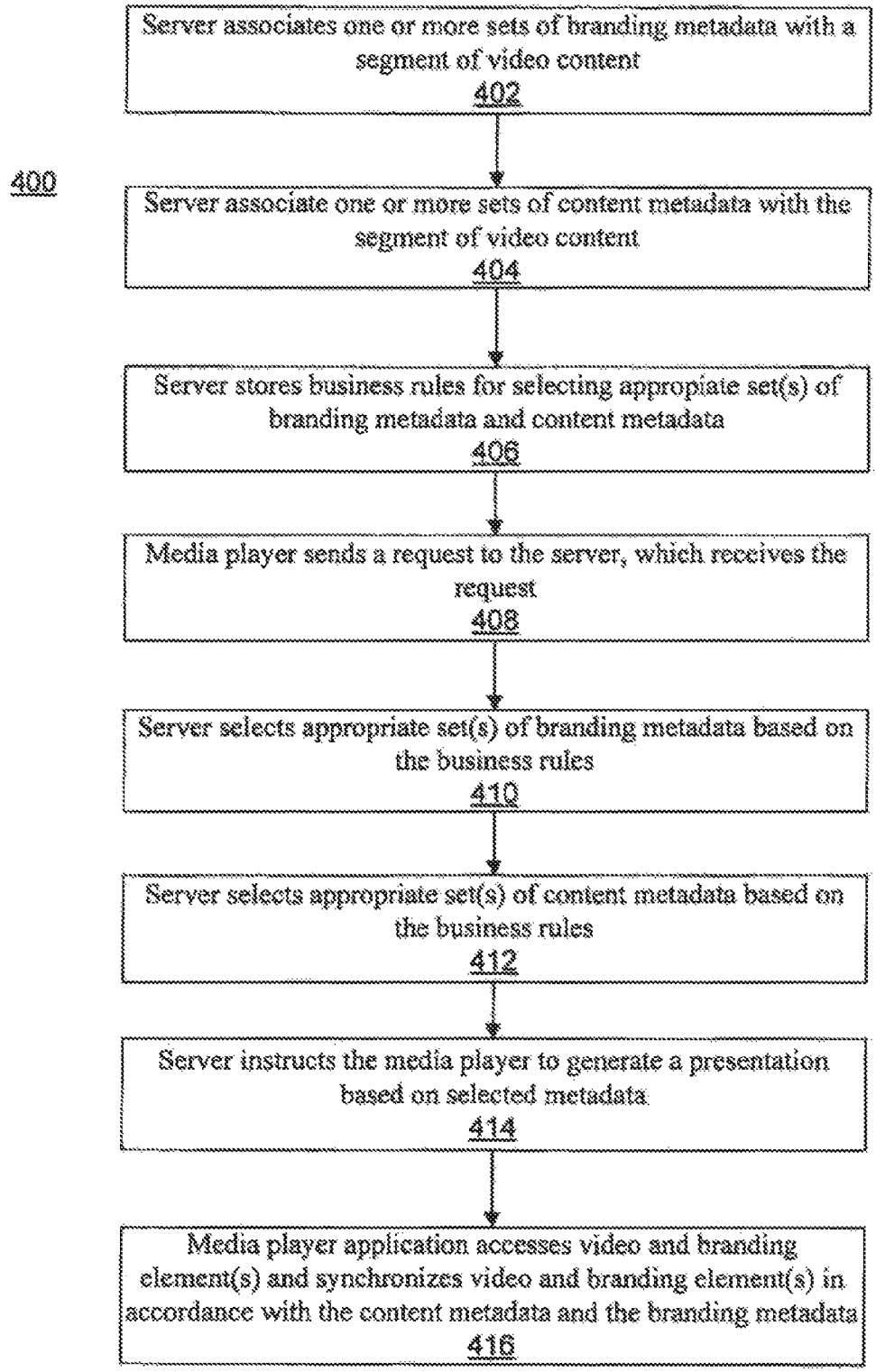
FIG. 4 is an example of a process that may be performed by the server shown in FIG. 2.

Referring to FIG. 4, a process 400 may be implemented, for instance, by server 206 and media player application 208 (or media player application 210). Server 206 associates one or more sets of branding metadata with a segment of video content (402). Each of the sets of branding metadata include information related to presenting at least one branding element in association with the segment of video content. In addition, the server 206 associates one or more sets of content metadata with the segment of video content (404). Each of the sets of content metadata include information related to presenting the segment of video content. The server 206 also stores business rules for selecting at least one of the sets of branding metadata and for selecting at least one of the sets of content metadata (406). The media player application 208 sends a request to the server 206, which receives the request (408). In response to receiving the request, the server 206 selects at least one of the sets of branding metadata associated with the segment of video content based on the business rules (410). The server 206 also selects at least one of the sets of content metadata associated with the segment of video content based on the business rules (412). Based on the selected set of branding metadata and the selected set of content metadata, the server 206 instructs the media player application 208 to generate a presentation that includes the segment of video content and the branding element (414). In response, the media player application 208 accesses the segment of video content and the branding element and generates a presentation that synchronizes the segment of video content and the branding element in accordance with the content metadata and the branding metadata (416).

The above described techniques may allow for video assets to be re-used with different branding elements, and with different behaviors of the branding elements by enabling an advertising and/or editorial stall to enter and associate multiple sets of branding metadata with a given segment of video content, enabling them to indicate business rules for selecting which set(s) to use, and causing the client system to access and synchronize the video and branding elements. This also may allow for flexible, and arbitrarily complex, placement of branding elements with video content. For instance, the logo used for content accessed from a particular surface location may be changed. By referencing the new logo in the branding metadata, the logo displayed when the sports clip is presented can be updated.

Accordingly, in general, the described system may provide for a brand, playlist and ad management system, where the branding elements and content are synchronized at the client rather than at the head end, on a client specific basis, separate from, but potentially coordinated with, the content management and distribution system. The described system also may provide for the synchronization of branding and content elements based on events introduced in the content management and distribution system that specify the general class of brand elements to be introduced into the content, rather than the specific elements. Furthermore, the system may allow the client to then request the branding elements, thereby allowing severs other than the main content server to provide the branding elements. As such, multiple servers could deliver video content and branding elements to a single client based upon a client initiated request or a server initiated request.

The branding elements associated with a segment of video content may be interactive elements, which may allow for the following applications.

For example, interactive elements may allow for product purchases. Specifically, interactive branding elements may be introduced to allow a user to select for purchase an item displayed in the video. Interactive branding elements also may allow for selection of additional video segments related to a selected video segment. For instance, a specific show might have an additional segment for display, such as an interview with the cast for a particular episode of the show. An option to view such an additional segment may be presented as a branding element that is displayed daring or immediately after the show, possibly without interfering with the show itself. An example of such a scenario provides an interactive element that the user can click on or mouse over. This causes a menu to be expanded that shows the additional segments available for the show. The user selecting the additional segment then cause that additional segment be played, with perhaps an intervening sponsor message.

Interactive elements also may allow for audience voting. For example, the audience may be solicited to provide input on a topic, and then the result is displayed on screen. First the topic to vote on may be displayed, and then the choices, which the user then selects, and finally the result may be tallied and displayed on screen.

As another example, interactive elements may allow for email or IM notification and for home automation interaction. For instance, when the user's email or IM is notified, a pop-up may be blended into the video, and the user may then select to transition to the email or IM application. Home automation notifications may include home alarms, HVAC, or lighting controls.

The techniques described above are not limited to any particular hardware or software configuration. Rather, they may be implemented using hardware, software, or a combination of both. The methods and processes described may be implemented as computer programs that are executed on programmable computers comprising at least one processor and at least one data storage system. The programs may be implemented in a high-level programming language and may also be implemented in assembly or other lower level languages, if desired.

Any such program will typically be stored on one or more computer-usable storage media or devices (for example, CD-ROM, RAM, or magnetic disk). When read into the processor of the computer and executed, the instructions of the program cause the programmable computer to carry out the various operations described above.

A number of implementations have been described. Nevertheless, it will be understood that various modifications may be made. For example, elements of one or more implementations may be combined, deleted, supplemented, or modified to form further implementations. Accordingly, other implementations are within the scope of the following claims.

What is claimed is:

1. A method for presenting branding with electronic content, the method comprising the following operations performed by at least one processor:
    receiving, from a user device, a request that identifies a segment of electronic content and that contains information specifying a display window state of the user device;
    selecting, based on the information associated with the user device, first metadata including information defining how at least one branding element is to be presented based on the display window state of the user device;
    selecting second metadata for the requested segment of electronic content, the second metadata including information related to presenting the requested segment of electronic content; and
    instructing the user device to generate a presentation based on the selected first metadata and the selected second metadata, the presentation including the requested segment of electronic content and the at least one branding element that is presented based on the display window state of the user device.

2. The method of claim 1, wherein:
    the second metadata indicates that the segment of electronic content should be presented in a fullscreen state of the window;
    the first metadata defines that the at least one branding element is to be presented in the window with the segment of electronic content in the fullscreen state; and
    instructing the user device to generate the presentation includes instructing the user device to generate the presentation such that the segment of electronic content and the at least one branding element are presented together in the window in the fullscreen state.

3. The method of claim 2, further comprising:
    instructing, with the at least one processor, the user device to generate the presentation such that the at least one branding element is overlayed on top of the segment of electronic content in window in the fullscreen state.

4. The method of claim 2, wherein:
    the second metadata further indicates that the at least one branding element should be overlayed on top of the segment of electronic content when the window is in the fullscreen state; and
    instructing the user device to generate the presentation includes instructing the user device to generate the presentation such that the at least one branding element is overlayed on top of the segment of electronic content when the video-rendering window is in the fullscreen state.

5. The method of claim 2, wherein:
    the first metadata further indicates that the at least one branding element should be presented in an area around the window when the window is not in a fullscreen state; and
    instructing the user device to generate the presentation includes instructing the user device to generate the presentation such that the at least one branding element is presented in an area surrounding the window when the window is not in the fullscreen state.

6. The method of claim 1, further comprising:
    accessing rules for selecting the first metadata and for selecting at least one of the second metadata.

7. The method of claim 6, wherein the rules include rules for selecting the first metadata and the second metadata based on one or more of the following: a surface location from which the segment of electronic content was selected, user-specific information, a content category of the segment of electronic content, and an identity of the segment of electronic content.

8. The method of claim 1, wherein the at least one branding element includes one or more of the following: an advertising element, a playlist contextual element, an environmentally-targeted contextual element, and a program contextual element.

9. The method of claim 1, further comprising:
instructing, with the at least one processor, the user device to generate the presentation includes instructing the user device to access and present the at least one branding element while the segment of electronic content is presented.

10. The method of claim 1, further comprising:
instructing, with the at least one processor, the user device to blend together the at least one at branding element and the segment of electronic content to create a single video file.

11. The method of claim 1, wherein the second metadata further includes a playlist of media items, at least one of the media items being the segment of electronic content.

12. The method of claim 11, wherein the first metadata further indicates that the at least one branding element is a playlist contextual element and that the information presented by the playlist contextual element is to be obtained from the playlist.

13. The method of claim 11, further including, prior to receiving the request, associating the first metadata with the segment of electronic content and associating the second metadata with the segment of electronic content.

14. A method for presenting branding with electronic content, the method comprising the following operations performed by at least one processor:
receiving an indication of a request by a client device to access a desired segment of electronic content;
selecting first metadata for a content element associated with the desired segment of electronic content and with one or more branding elements, the first metadata including branding presentation information defining how the one or more branding elements are to be presented based on a display configuration of a user device and branding element locations for retrieving the branding elements;
selecting second metadata associated with the desired segment of electronic content and with one or more segments of electronic content, the second metadata including content presentation information relating to presenting the segments of electronic content and electronic content element locations for retrieving the segments of electronic content;
transmitting instructions to the user device to:
retrieve the desired segment of electronic content based on the electronic content element location contained in the selected second metadata;
retrieve the branding element based on the branding element location in the selected first metadata, and
generate a presentation including the retrieved segment of electronic content and the retrieved branding element, based on the content presentation information and on the branding presentation information respectively contained in the selected second metadata and in the selected first metadata, such that the retrieved branding element is presented based on the display configuration of the user device.

15. The method of claim 14, wherein the content presentation information indicates states of display windows used to view the segments of electronic content.

16. The method of claim 15, wherein the states include at least one of a fullscreen display state or a partial screen display state for the segments of electronic content.

17. The method of claim 15, further comprising:
transmitting, with the at least one processor, instructions to the user device to display the retrieved segment of electronic content using a state contained in the selected second metadata.

18. The method of claim 14, wherein the content presentation information includes at least one of display behaviors, display positions, display properties, and user interface functions of the branding content elements.

19. The method of claim 14, further comprising:
accessing rules for selecting branding content elements for presentation with the segments of electronic content, the rules including rules for selecting the first metadata and the second metadata based on at least one of a surface location of a web page associated with the desired segment of electronic content, a content category associated with the desired segment of electronic content, or information about a user associated with the user device.

20. A system for presenting branding with electronic content, the system comprising:
a communication device for communicating with a user device over an electronic network; and
at least one processor configured to:
receive, from the user device via the communication device, a request that identifies a segment of electronic content;
selecting a first metadata for the identified segment of electronic content, the selected first metadata including information defining how branding is to be presented based on a display window state of the user device;
selecting second metadata for the identified segment of electronic content, the selected second metadata including information related to presenting the segment of electronic content; and
instructing the user device, over the electronic network via the communication device, to generate a presentation based on the selected first metadata and the selected second metadata, the presentation including the segment of electronic content and at least one branding element that is presented based on the display window state of the user device.

* * * * *

UNITED STATES PATENT AND TRADEMARK OFFICE
CERTIFICATE OF CORRECTION

PATENT NO. : 9,794,617 B2
APPLICATION NO. : 15/148345
DATED : October 17, 2017
INVENTOR(S) : G. Thomas Des Jardins Page 1 of 1

It is certified that error appears in the above-identified patent and that said Letters Patent is hereby corrected as shown below:

In Claim 10, Column 15, Line 22, "the at least one at" should read --the at least one--.

Signed and Sealed this
Twenty-seventh Day of February, 2018

Andrei Iancu
*Director of the United States Patent and Trademark Office*